United States Patent
Dykstra et al.

(10) Patent No.: US 11,585,190 B2
(45) Date of Patent: Feb. 21, 2023

(54) COORDINATED CONTROL FOR MUD CIRCULATION OPTIMIZATION

(71) Applicant: Halliburton Energy Services, Inc., Houston, TX (US)

(72) Inventors: Jason D. Dykstra, Spring, TX (US); Yuzhen Xue, Humble, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 804 days.

(21) Appl. No.: 16/574,058

(22) Filed: Sep. 17, 2019

(65) Prior Publication Data

US 2020/0011159 A1  Jan. 9, 2020

Related U.S. Application Data

(63) Continuation of application No. 15/324,128, filed as application No. PCT/US2016/042150 on Jul. 13, 2016, now abandoned.
(Continued)

(51) Int. Cl.
  *G05B 13/04* (2006.01)
  *E21B 41/00* (2006.01)
  (Continued)

(52) U.S. Cl.
  CPC ........ *E21B 41/0092* (2013.01); *E21B 21/062* (2013.01); *E21B 21/063* (2013.01); *E21B 21/08* (2013.01); *E21B 44/00* (2013.01); *G05B 13/04* (2013.01); *G05B 17/00* (2013.01); *G05B 23/02* (2013.01); *G05D 7/00* (2013.01);
  (Continued)

(58) Field of Classification Search
  None
  See application file for complete search history.

(56) References Cited

U.S. PATENT DOCUMENTS 7,054,750 B2 *  5/2006  Rodney ................... E21B 41/00
                                                                    702/9
7,219,747 B2 *  5/2007  Gleitman ................ E21B 28/00
                                                                    175/45
(Continued)

FOREIGN PATENT DOCUMENTS

WO    2004090285 A1    10/2004
WO    2013169543 A2    11/2013
(Continued)

OTHER PUBLICATIONS

PCT/US2016/042150 International Search Report, dated Oct. 19, 2016, 3 pages.
(Continued)

*Primary Examiner* — Philip Wang
(74) *Attorney, Agent, or Firm* — Delizio, Peacock, Lewin & Guerra

(57) ABSTRACT

Two control strategies may be implemented to optimize mud circulation in a drilling mud circulation system. In a networked control strategy, the mud circulation system does not involve any centralized controller yet all the local controllers can exchange information in real-time via a central data storage. The master-slave control strategy involves a centralized optimizer, and the subsystems are treated as slave systems and are driven by a visual master control system.

20 Claims, 5 Drawing Sheets

Related U.S. Application Data

(60) Provisional application No. 62/191,691, filed on Jul. 13, 2015.

(51) Int. Cl.

| | | |
|---|---|---|
| *G06Q 50/00* | (2012.01) | |
| *G06F 30/20* | (2020.01) | |
| *G05D 7/00* | (2006.01) | |
| *G05B 17/00* | (2006.01) | |
| *G05B 23/02* | (2006.01) | |
| *E21B 44/00* | (2006.01) | |
| *E21B 21/06* | (2006.01) | |
| *E21B 21/08* | (2006.01) | |

(52) U.S. Cl.
CPC ............ *G06F 30/20* (2020.01); *G06Q 50/00* (2013.01); *E21B 21/06* (2013.01)

(56) References Cited

U.S. PATENT DOCUMENTS

| | | | |
|---|---|---|---|
| 8,281,875 B2 | 10/2012 | Lovorn et al. | |
| 8,517,692 B2* | 8/2013 | Hopwood | E21B 21/08 175/48 |
| 8,567,525 B2 | 10/2013 | Reitsma | |
| 2004/0108138 A1* | 6/2004 | Cooper | E21B 21/10 175/26 |
| 2009/0194330 A1* | 8/2009 | Gray | E21B 21/08 175/48 |
| 2014/0166361 A1* | 6/2014 | Jamison | E21B 44/00 175/24 |
| 2015/0105912 A1* | 4/2015 | Dykstra | E21B 47/00 700/275 |
| 2015/0122490 A1* | 5/2015 | Greening | E21B 21/08 166/250.01 |
| 2015/0369030 A1 | 12/2015 | Hay et al. | |
| 2016/0194949 A1 | 7/2016 | Dirksen | |
| 2018/0347298 A1* | 12/2018 | Xue | G05B 17/02 |
| 2022/0229994 A1* | 7/2022 | Sharma | H04L 51/10 |
| 2022/0260973 A1* | 8/2022 | Swank | G05B 19/4184 |
| 2022/0261184 A1* | 8/2022 | Mylavarapu | G06F 3/0644 |
| 2022/0261545 A1* | 8/2022 | Lauber | G06F 40/30 |
| 2022/0261626 A1* | 8/2022 | Liu | G06N 3/08 |

FOREIGN PATENT DOCUMENTS

| | | |
|---|---|---|
| WO | 2014011171 A1 | 1/2014 |
| WO | 2015072962 A1 | 5/2015 |

OTHER PUBLICATIONS

PCT/US2016/042150 Written Opinion, dated Oct. 19, 2016, 14 pages.

* cited by examiner

COORDINATED CONTROL FOR MUD CIRCULATION OPTIMIZATION

TECHNICAL FIELD

The disclosure generally relates to the field of data processing for mud circulation system control.

BACKGROUND

The mud circulation systems and components that make up the drilling mud circulation system thereof are complex and include many subsystems such as mud pipes, solid removers (e.g., shakers), mixers, pumps, and chokes. The mud density, viscosity, flow rate, and pump pressure are important manipulating variables to ensure a safe and smooth drilling process. In literature, several control methods have been proposed for controlling the pump, shaker, and mixer to get mud with desired quality. Mud quality refers to the ability for the mud to retain the cutting removing efficiency and preserve the borehole stability. Higher quality muds increase the efficiency and efficacy of drilling operations.

In current mud circulation systems, each subsystem of the mud circulation system has an independent controller. This framework is referred to as "decentralized control strategy." The obvious drawback of a decentralized control strategy is that each controller only monitors its own performance. Simple examples show that turning on two feedback systems, each with its own sensor and actuator, simultaneously, can lead to disastrous loss of performance, or even instability. This is due to the interaction of the subsystems such that each controller will compete or even contradict with the other subsystems/controllers and thus reduce the overall system's performance. In the mud control, for example, if the controller on the choke and the controller on the pump are trying to control the flow rate/pressure independently, the choke controller may be saturated quickly because it does not consider the output from the pump controller. This may reduce the overall performance of the mud pressure/flow rate adjustment or even damage the choke.

BRIEF DESCRIPTION OF THE DRAWINGS

The following figures are included to illustrate certain aspects of the embodiments and should not be viewed as exclusive embodiments. The subject matter disclosed is amenable to considerable modifications, alterations, combinations, and equivalents in form and function, as will occur to those skilled in the art and having the benefit of this disclosure.

Figure 1:
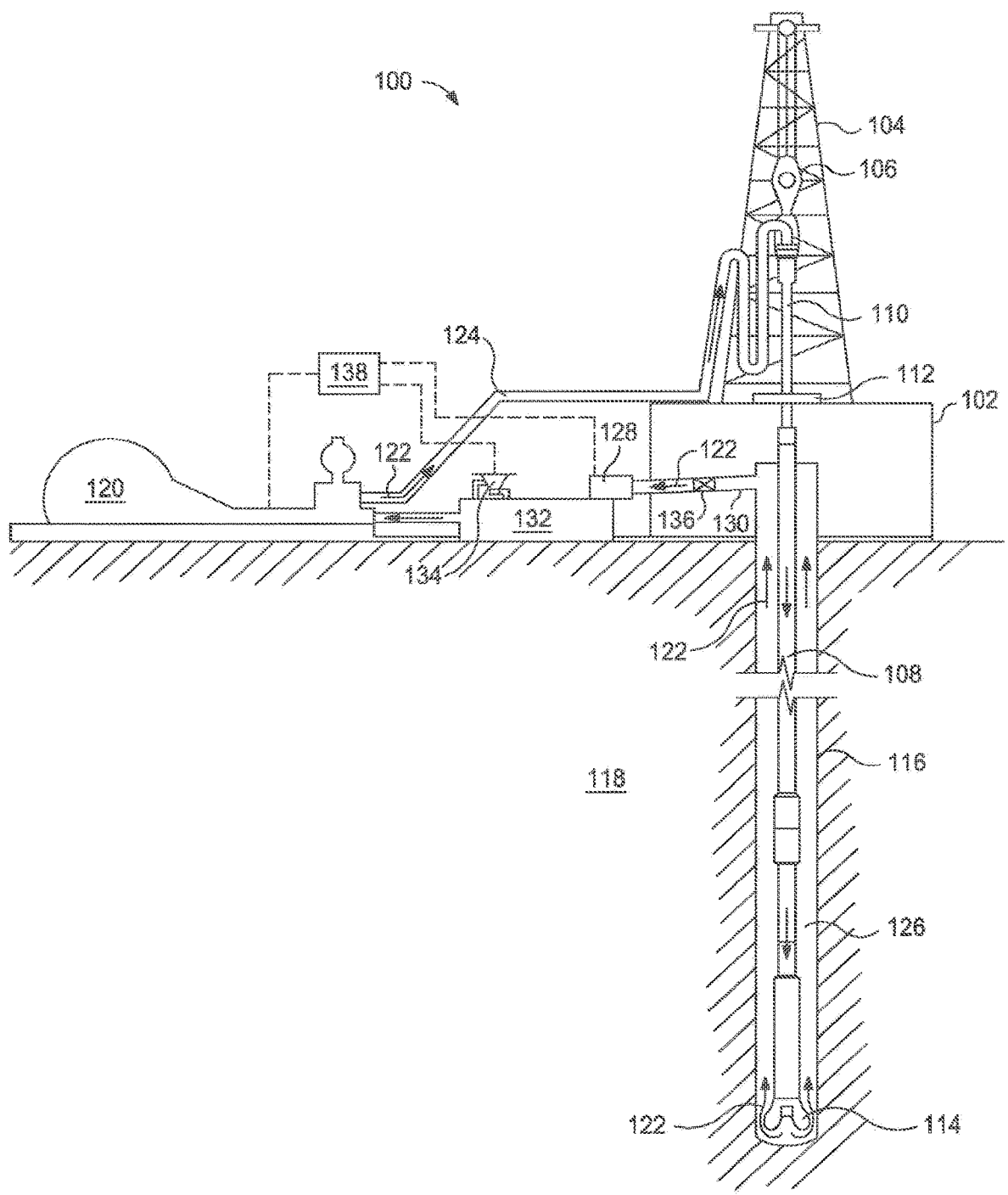
FIG. 1 illustrates an exemplary mud circulation system suitable for implementing the methods described herein.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are methods and systems for enhancing workflow performance in the oil and gas industry. More specifically, the present application relates to optimizing mud (also known as "drilling mud") circulation through coordinated control schemes.

During drilling, many systems/units are coupled through the mud flow. Each of the systems has its own controller that can impact the mud circulation quality. If each unit is only controlled independently without considering the other units output, limitation, or response time, the result will be sub-optimal or it may even damage the hardware. The coordinated control schemes of the present disclosure may be used to derive a true optimal mud circulation, coordinate all the units, and enable the units to exchange information such that all the units can make their contribution to the global optima without contradicting the other systems.

FIG. 1 illustrates an exemplary mud circulation system (also referred to herein as a "mud circulation system") suitable for implementing the methods described herein. While FIG. 1 generally depicts a land-based drilling assembly, those skilled in the art will readily recognize that the principles described herein are equally applicable to subsea drilling operations that employ floating or sea-based platforms and rigs without departing from the scope of the disclosure.

As illustrated, the drilling assembly 100 may include a drilling platform 102 that supports a derrick 104 having a traveling block 106 for raising and lowering a drill string 108. The drill string 108 may include, but is not limited to, drill pipe and coiled tubing, as generally known to those skilled in the art. A kelly 110 supports the drill string 108 as it is lowered through a rotary table 112. A drill bit 114 is attached to the distal end of the drill string 108 and is driven either by a downhole motor and/or via rotation of the drill string 108 from the well surface. As the bit 114 rotates, it creates a borehole 116 that penetrates various subterranean formations 118.

A pump 120 (e.g., a pump) circulates mud 122 through a feed pipe 124 and to the kelly 110, which conveys the mud 122 downhole through the interior of the drill string 108 and out through one or more orifices in the drill bit 114. The mud 122 is then circulated back to the surface via an annulus 126 defined between the drill string 108 and the walls of the borehole 116. At the surface, the recirculated or spent mud 122 exits the annulus 126 and may be conveyed through chokes 136 (also referred to as a choke manifold) to one or more mud cleaning unit(s) 128 (e.g., a shaker, a centrifuge, a hydrocyclone, a separator (including magnetic and/or electrical separators), a desilter, a desander, a separator, a filter, a heat exchanger, any fluid reclamation equipment, and the like) via an interconnecting flow line 130. After passing through the mud cleaning unit(s) 128, a "cleaned" mud 122 is deposited into a nearby retention pit 132 (e.g., a mud pit or mud tank). While illustrated arranged at the outlet of the wellbore 116 via the annulus 126, those skilled in the art will readily appreciate that the mud cleaning unit(s) 128 may be arranged at any other location in the drilling assembly 100 to facilitate its proper function, without departing from the scope of the disclosure.

At the retention pit 132 (or before or after), the mud circulation system may include mud treatment unit(s). The mud 122 may be treated to change its composition and properties. For example, weighting agents like barite may be added to the mud 122 to increase its density. In another example, base fluid may be added to the mud 122 to decrease its density. In the illustrated mud circulation system 100, the addition of materials to the mud 122 may be achieved with a mixing hopper 134 communicably coupled to or otherwise in fluid communication with the retention pit 132. The mixing hopper 134 may include, but is not limited to, mixers and related mixing equipment known to those skilled in the art. In other embodiments, however, the materials may be added to the mud 122 at any other location in the drilling assembly 100. In at least one embodiment, for example, there could be more than one retention pit 132, such as multiple retention pits 132 in series. Moreover, the retention pit 132 may be representative of one or more fluid storage facilities and/or units where the materials may be stored, reconditioned, and/or regulated until added to the mud 122.

The various components of the mud circulation system 100 may further include one or more sensors, gauges, pumps, compressors, and the like used store, monitor, regulate, convey, and/or recondition the exemplary muds 122 (e.g., sensors and gauges to measure the composition and/or pressure of the mud, compressors to change the pressure of the mud, and the like).

While not specifically illustrated herein, the disclosed mud circulation system 100 may include drill collars, mud motors, downhole motors, and/or pumps associated with the drill string 108, MWD/LWD tools and related telemetry equipment, sensors or distributed sensors associated with the drill string 108, downhole heat exchangers, valves and corresponding actuation devices, tool seals, packers and other wellbore isolation devices or components, and the like. The mud circulation system 100 may further include control systems (e.g., the controllers and control systems described further herein) that are capable of executing the mathematical algorithms, methods, and mud circulation system control described herein. The mud circulation system 100 may also further include a control system 138 communicably coupled to various components of the mud circulation system 100 (e.g., the mixer 134, a downhole motor, the pump 120, sensors, and the like) and be capable of executing the mathematical algorithms, methods, and mud circulation system control described herein.

The methods described herein use coordinated control schemes to manage the drilling mud circulation system and optimize, maintain, or enhance the mud quality. In this disclosure, two coordinated control schemes are proposed to improve the mud circulation efficiency.

The first coordinated control scheme described herein is a "networked control strategy." In the proposed framework, the mud circulation system has physically distributed processing power and networked (wired/wireless) communication. Each subsystem (e.g., the shaker, mixer, pump, choke, and the like) has its own local controller and computation power. No supervisory controller is adopted in the networked control strategy so that all the local controllers can calculate its best control input in their own time scale and in parallel (thus it provides high efficiency). This scheme naturally matches the physically distributed mud subsystems and satisfies the hard constraints of each subsystem. Moreover, it has high fault tolerance such that the failure of one subsystem may not be fatal to the overall performance. Each local controller calculates its control input to drive the overall cost function to optimal, based on all the subsystems' states and control inputs (obtained via communication). The networked control strategy has shown success in chemical plant control where all the subsystems/local controllers are coordinated so that the overall system's performance would converge to the optimal.

Figure 2:
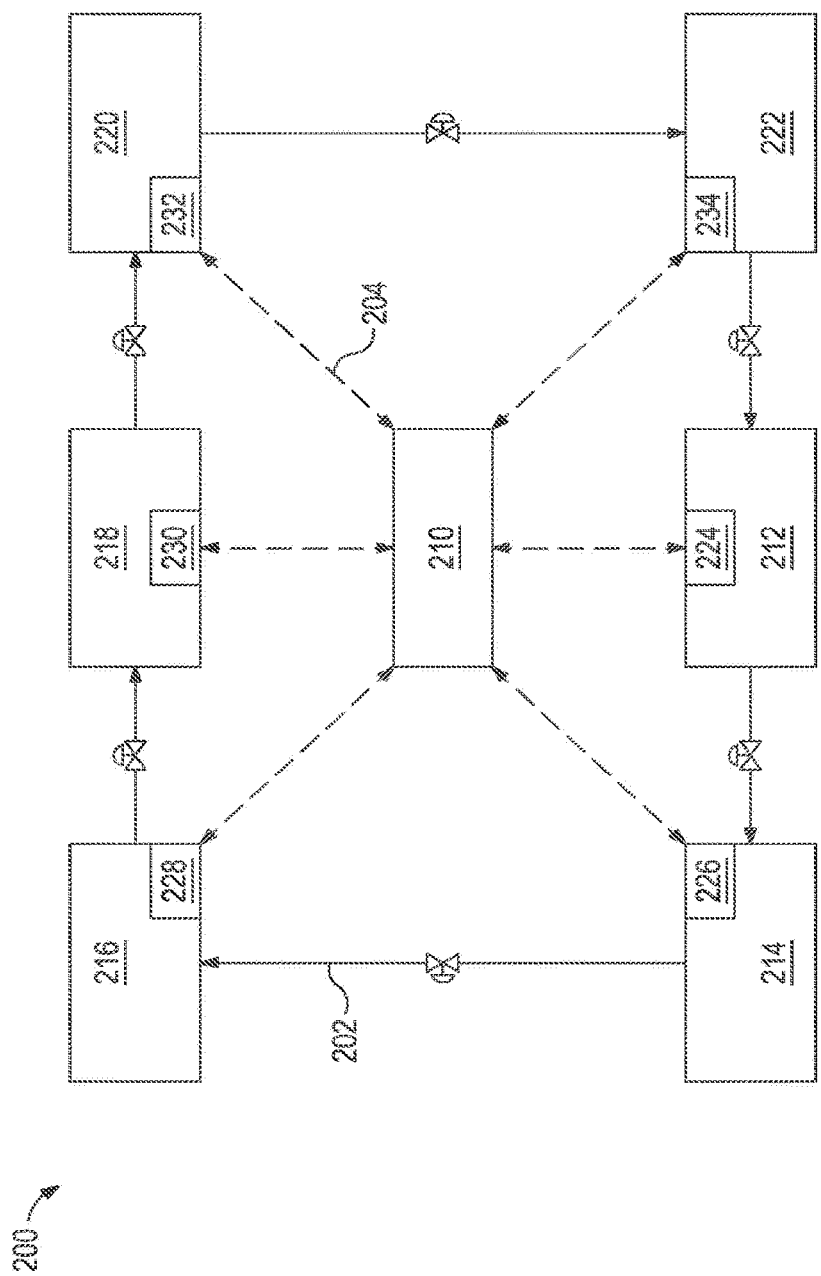
FIG. 2 illustrates an exemplary layout of a networked control strategy for a mud circulation system.

FIG. 2 illustrates an exemplary layout of a networked control strategy for a mud circulation system 200. The illustrated mud circulation system 200 uses solid arrows 202 between subsystems 212-222 to illustrate mud flow direction. As illustrated, the mud circulation system includes, in order, a pump 212 (e.g., pump 120 of FIG. 1), a choke 214 (e.g., choke 136 of FIG. 1), a drilling control 216 (e.g., drill string 108, kelly 110, and rotary table 112) that controls the drill bit operational parameters (e.g., revolutions per minute, weight on bit, and rate of penetration), a mud cleaning unit(s) 218 (e.g., mud cleaning unit(s) 128 of FIG. 1), a mud treatment unit(s) 220 (e.g., mixer 134 of FIG. 1), and a mud tank 222 (e.g., retention pit 132 of FIG. 1) that flows back into the pump 212. Each of the subsystems 212-222 have individual controllers 224-234, respectively, (also referred to as local controllers or control systems).

Each controller 224-234 of the subsystems 212-222 may communicate (illustrated with dashed arrows 204) with a central data storage 210. The central data storage 210 may communicate back to the subsystems 212-222 the real-time data about one or more of the other subsystems 212-222. The mud circulation system 200 is modelled as a distributed/coordinated system that contains not only the subsystems' models but also the subsystems' interaction models. Each subsystem may include an advanced controller and state predictor (e.g., model predictive control (MPC)) to calculate the optimal control command and to compensate delays. The local controllers 224-234 may be used to calculate the best local control policies under the local constraints to try to optimize overall objective of the mud circulation system.

The proposed networked control layout may be used for various mud circulation control applications, for example, to optimize the rate of penetration (ROP) of the drill bit, to regulate the bottom hole pressure (BHP), to retain the cutting transmission efficiency, to minimize the mud cost while drilling, and the like. For example, operational parameters of or otherwise related to the pump 212 (e.g., pump rate, rate of change of pump rate, and the like, and any combination thereof) may be measured, shared with other subsystems 214-222 via the central data storage 210, and optimized. Operational parameters of or otherwise related to the drilling control 216 (e.g., weight on bit, rate of penetration, revolution per minute, and the like, and any combination thereof) may be measured, shared with other subsystems 212-214,218-222 via the central data storage 210, and optimized. Operational parameters of or otherwise related to the choke 214 (e.g., BHP, rate of change of BHP, and the like, and any combination thereof) may be measured, shared with other subsystems 212,216-222 via the central data storage 210, and optimized. Operational parameters of or otherwise related to the mud cleaning system 218 (e.g., shaker operational parameters, centrifuge operational parameters, hydrocyclone operational parameters, separator operational parameters, and the like, and any combination thereof) may be measured, shared with other subsystems 212-216,220-222 via the central data storage 210, and optimized. Operational parameters of or otherwise related to the mud treatment system 220 (e.g., mixing rate, concentration of materials added to the mud, rate of addition of the materials to the mud, and the like, and any combination thereof) may be measured, shared with other subsystems 212-218,222 via the central data storage 210, and optimized. Operational parameters of or otherwise related to the mud tank 222 (e.g., retention time, mixing parameters, and the like, and any combination thereof) may be measured, shared with other subsystems 212-220 via the central data storage 210, and optimized.

Figure 3:
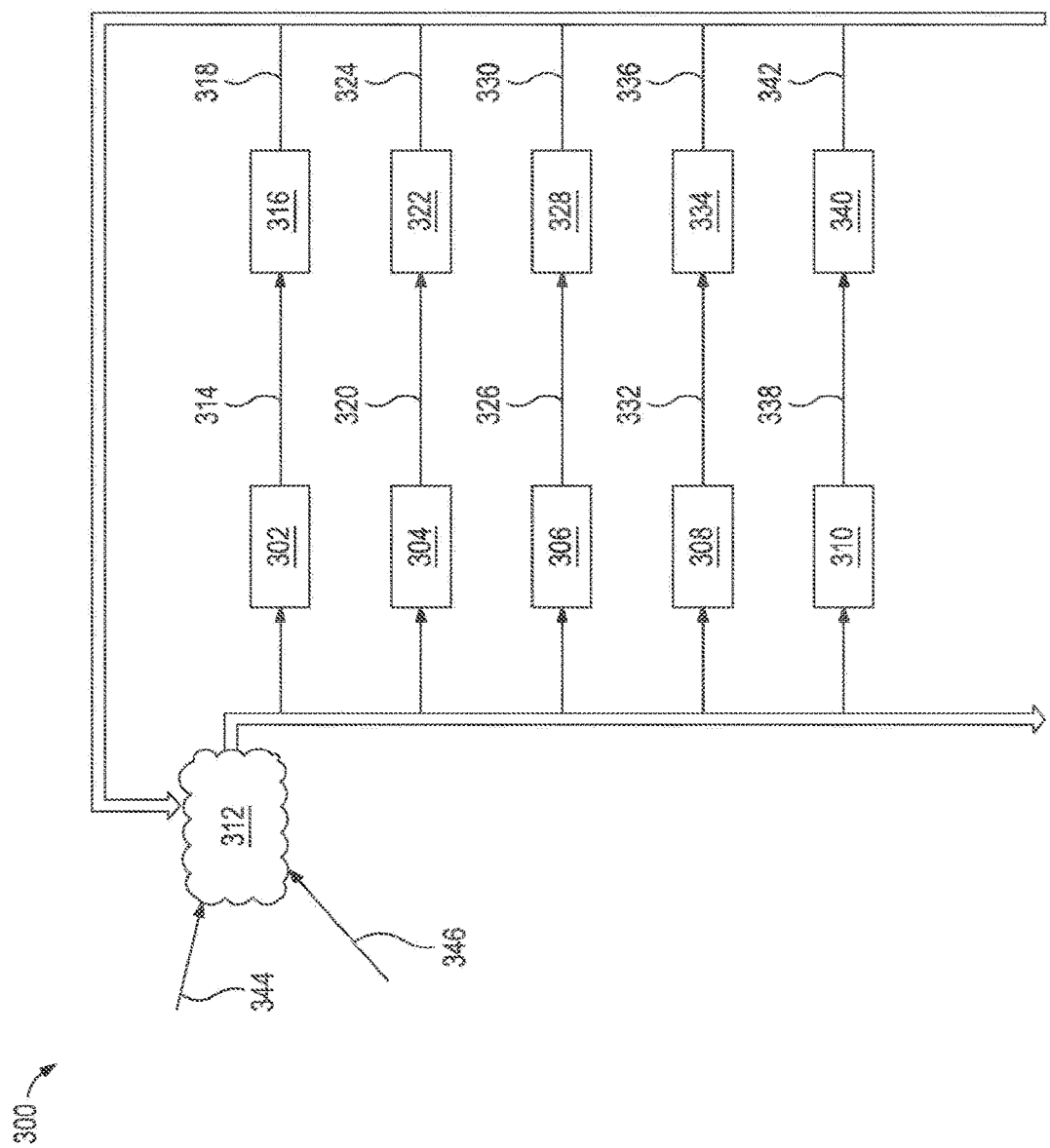
FIG. 3 illustrates the cooperation of the mud subsystem controllers in the networked control strategy.

For example, FIG. 3 illustrates an exemplary layout 300 of the cooperation of the subsystem controllers 302-310 to maximize the ROP while drilling through a narrow kick-loss pressure margin (i.e., drilling through a portion of the formation where the difference between the kick pressure and the fracture pressure is small). The cost function is constructed according to Equation 1.

$$\text{cost} = \int a_1 (ROP - ROP^*)^2 + a_2\left(P_b - \frac{P_{kick} + P_{loss}}{2}\right)^2 + a_3 w^2 + a_4 c^2 + a_5 q^2 \quad \text{Equation 1}$$

where $P_b$ denotes the estimated or measured BHP, the $P_{kick}$ denotes the kick pressure, the $P_{loss}$ denotes the fracture pressure, the w denotes the bit wear and the motor wear, the c denotes the mud and drilling cost, the q denotes the quality (smoothness) index of the wellbore (smaller q represents higher wellbore quality), the $a_1$ to $a_5$ denote the weights, here for $a_i \geq 0$ for any i. The values of weights $a_1$ to $a_5$ are adaptable for different situations.

Figure 4:
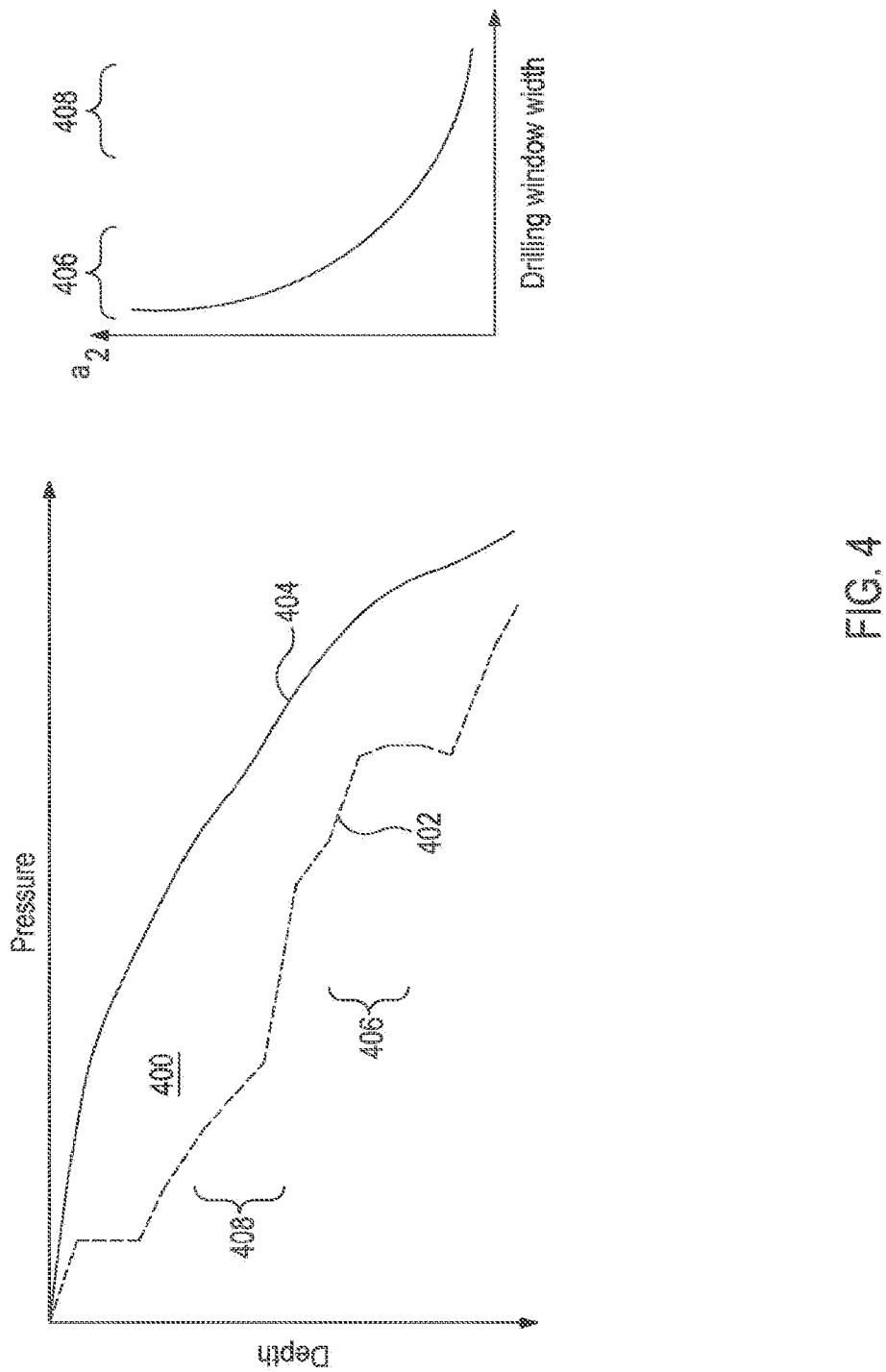
FIG. 4 illustrates the adaption of weight used in the networked control strategy.

FIG. 4 illustrates the adaption of weight $a_2$. To safely and effectively drill, the borehole pressure should be within the drilling window 400, which is defined as the pressures between the pore pressure 402 and fracture pressure 404 of the formation. When drilling through a narrow portion 406 of the drilling window 400 as illustrated in the plot on the right of FIG. 4, $a_2$ shall be adjusted to a dominant value such that the pressure is tightly regulated. When drilling through a wide portion 408 of the drilling window 400, the pressure regulation may be somewhat relaxed and thus $a_2$ can have a relative smaller value. The coordinated subsystem controllers 302-310 should determine operating conditions for the corresponding component of the mud circulation system so as to minimize the cost function subject to the mechanical constraints as well as the subsystems' and the subsystems' interaction models. These interaction models show the coupling between the various systems. For example, a value performance is based on the input pressure, and if fed by a pump (e.g., pump 120 of FIG. 1), that pressure is dependent on the speed and applied torque to the pump. Since the interaction models describe the dynamic coupling and are included in the cost function analysis at the local sub-system level, the model will optimize the process across all relevant system states. Equation 2 may be used to describe the local control calculations.

$$u_i = \text{argmin}_{u_i \in \Omega_i} \text{cost} \quad \text{Equation 2}$$

where the $u_i$ denotes the $i^{th}$ subsystem's control law, and the $\Omega_i$ denotes the input space of the $i^{th}$ subsystem.

The optimal local control law is calculated such that it minimizes the overall cost function. Referring again to FIG. 3, there are five subsystem controllers 302-310 each associated with a subsystem, communicably coupled to a central data storage 312, and coordinating to fulfill the optimization objective. For example, the model executed by a first subsystem controller 302 may describe the viscosity (state) as a function of the current mud volume, the flow in rate, and the clay/bentonite additions (input). Then, the first subsystem controller 302 may output an action (e.g., addition of clay/bentonite 314) to be performed by a first mud treatment system 316 to achieve the desired viscosity that fulfills the optimization objective. Then, a real-time viscosity 318 at the first mud treatment 316 system may be measured and communicated to the central data storage 312. The model executed by a second subsystem controller 304 may describe the density(state) as a function of the current mud volume, the flow in rate, and the weighing material additions (input). Then, the second subsystem controller 304 may output an action (e.g., addition of weighting material 320) to be performed by a second mud treatment system 322 to achieve the desired density that fulfills the optimization objective. Then, a real-time density 324 at the second mud treatment system 322 may be measured and communicated to the central data storage 312. The model executed by a third subsystem controller 306 may describe the pressure/pump flow out rate (states) as function of the mud tank volume and pump motor rpm (input). Then, the third subsystem controller 306 may output an operational parameter (e.g., a pump rpm and/or pump pressure 326) to be performed by a pump 328 to achieve the desired the pressure/pump flow out rate that fulfills the optimization objective. Then, a real-time pressure/pump flow out rate 330 at the pump 328 may be measured and communicated to the central data storage 312. The model executed by a fourth subsystem controller 308 may describe pressure/choke flow out rate(states) as function of the choke valve position, pump pressure, and choke flow in rate (input). Then, the fourth subsystem controller 308 may output an operational parameter (e.g., the choke valve position, pump pressure, and choke flow in rate 332) to be performed by a choke 334 to achieve the desired pressure/choke flow out rate that fulfills the optimization objective. Then, a real-time pressure/choke flow out rate 336 at the choke 334 may be measured and communicated to the central data storage 312. The model executed by a fifth subsystem controller 310 may describe the ROP (state) as a function of WOB and/or RPM of the drill bit (input). Then, the fifth subsystem controller 310 may output an operational parameter (e.g., WOB and/or RPM of the drill bit 338) to be performed by a drill rig and string 340 to achieve the desired ROP that fulfills the optimization objective. Then, a real-time ROP 342 of the drill bit may be measured and communicated to the central data storage 312.

The interaction model reflects how the interaction states are affected by each subsystem's inputs. For example, the interaction models between (1) the sub system comprising the fifth subsystem controller 310 and drill rig and string 340 and (2) the other four subsystems describe how the ROP is affected by the pump pressure, flow rate, and the mud viscosity/density addition. The interaction models between subsystems may be derived by the decentralized identifications. The central data storage 312 stores the up-to-date kick-loss pressure profile 344 ($P_{kick}$ and $P_{loss}$ with respect to the TVD), the real-time estimated/measured TVD/BHP 346, the subsystems' models, the subsystems' interaction models, each subsystems' real-time states, interaction states, and control inputs. All the subsystems can access this information upon availability.

At current time step k, each subsystem collects the estimated/measured TVD/BHP, the other subsystems' states, inputs, and the interaction states. Based on all the models, each controller's control command is designed subject to its subsystem's constraints and to optimize the overall cost function, as shown in Equation 2. Due to that, the search region for each subsystem's control input/states is much smaller than that for the overall inputs/states, the computation load for each subsystem to seek for the optimal control input is substantially lower than that of a centralized controller. Once the calculation is done for each controller and the control command is implemented, the subsystem's states, input and interaction states are transmitted to the central data storage 312 and are accessible for new calculations for all the controllers at time step k+1. In this example, the other four subsystems can all impact the BHP. Therefore, the subsystems are coupled together but each has its own constraints (e.g., cost of adding weighting material is a constraint for the second subsystem controller 304, maximum pump pressure is a constraint in constraint for the third subsystem controller 306, and the maximum valve opening is a constraint for the second subsystem controller 308) and timescales (e.g., pump and choke have much faster time scales than mud mixer). The advantage of the proposed control scheme is that it does not only coordinate the controllers to optimize the cost function but also takes advantages of the different time scales of the three subsystems to further improve the efficiency. With the proposed distributed control scheme of the networked control strategy the short time scale subsystems (e.g., pump 328 (e.g., pump 120 of FIG. 1) and choke 334 (e.g., choke 136 of FIG. 1)) may run the control multiple times while the slow scale system is running one iteration (e.g., mud mixer 316,322 (e.g., mixer 134 of FIG. 1)). This may reduce the response time of the overall system in regulating the pressure. Moreover, as each subsystem has access to the other subsystems' models, the time delay between subsystems can be compensated by model based predictions.

The second coordinated control scheme described herein is a "master-slave control strategy." In the proposed framework, the subsystems (e.g., the shaker, mixer, pump, and mud circulation systems) may be controlled and coordinated through a center controller.

Figure 5:
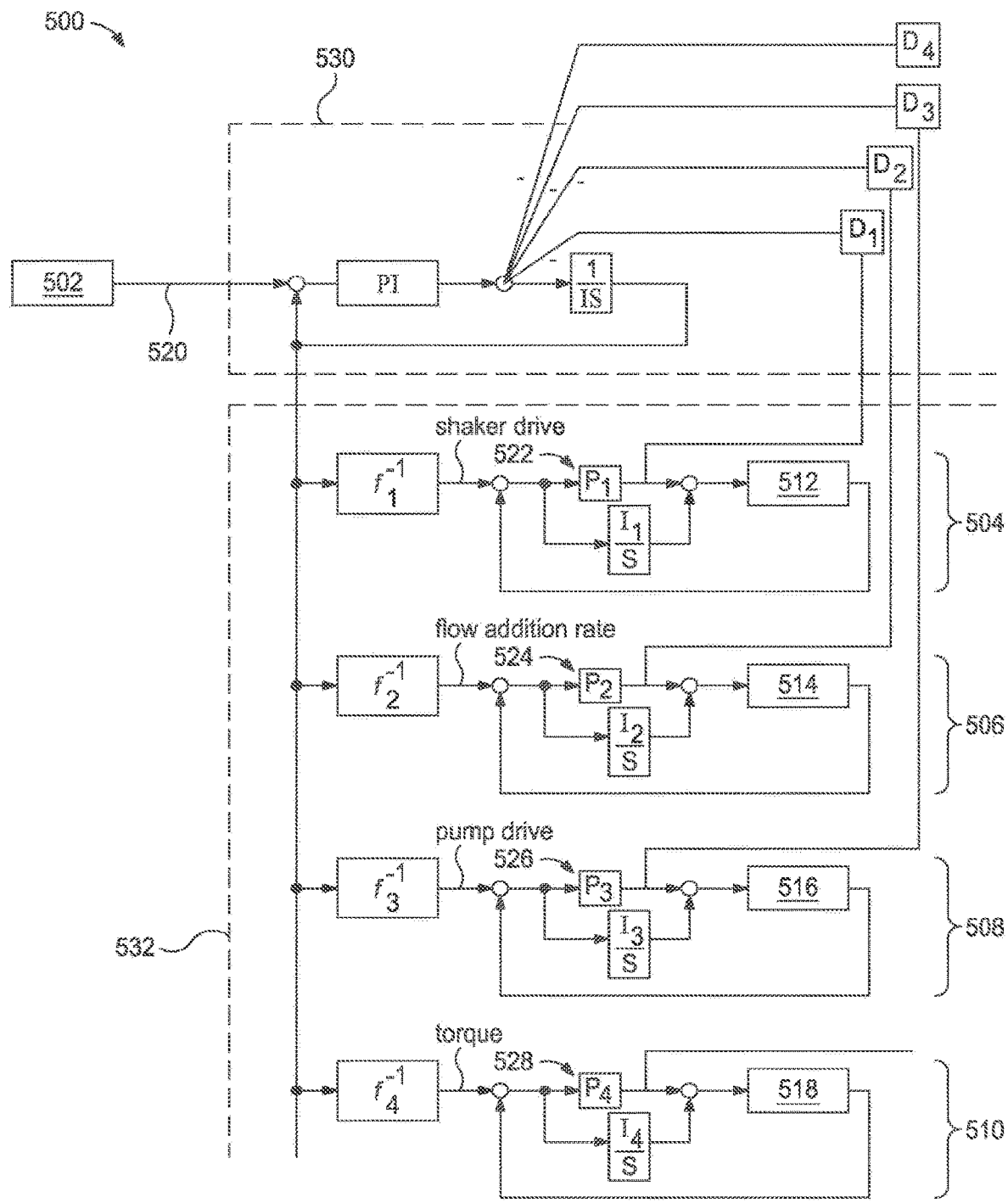
FIG. 5 illustrates an exemplary layout of a master-slave control strategy for a mud circulation system.

For example, FIG. 5 illustrates a mud circulation system 500 employing an exemplary master-slave control strategy. A supervisory optimizer controller 502 (e.g., controller 138 of FIG. 1) optimizes the mud circulation control system by calculating the optimal set point of the manipulate variables for each slave subsystem (e.g., the mud flow-in rate and the mud viscosity) based on, for example, the needs to minimize the cost function in Equation 1. Illustrated are four slave subsystems: a shaker subsystem 504 (comprising a shaker 512 (e.g., mud cleaning unit(s) 128 of FIG. 1) and a proportional-integral-derivative (PID) controller 522, which as illustrated applies proportional gain ($P_i$) and integral gain ($I_i$) to the inputs from the supervisory optimizer controller 502), a mixer subsystem 506 (comprising a mixer 514 (e.g., mixer 134 of FIG. 1) and a PID controller 524), a pump subsystem 508 (comprising a pump 516 (e.g., pump 120 of FIG. 1) and a PID controller 526), and a drill rig and string subsystem 510 (comprising a drill rig/string 518 (e.g., drill string 108, kelly 110, and rotary table 112) and a PID controller 528). The supervisory optimizer controller 502 (e.g., controller 138 of FIG. 1) adopts a virtual master control system 530 to drive the mud circulation system 500 to the desired viscosity and flow-in rate 520.

For each subsystem 504-510, a virtual inertia (I) is involved in the master control system 530 such that the rates of the subsystems with different time scales are coupled. The feedback of the master control system 530 is the input of the slave systems 532. Within each subsystem, the input (feedback of the master control system 530, which may be, for example, shaker drive for the shaker subsystem 504, flow addition rate for the mixer subsystem 506, pump drive for the pump subsystem 508, and torque for the drill rig and string subsystem 510) is then transferred into the subsystem's corresponding reference signals via inverse function block ($f_i^{-1}$) where a control loop feedback mechanism is applied via the PID controllers 522-528. The subsystems' adjustments ($D_i$) are fed forward to the master control system 530. With the proposed layout of the master-slave control strategy, the convergence of the master system 530 and thus the mud control process is sped up and all the subsystems are by nature operating within its operating limit.

The proposed methods provide two approaches to networked control architectures that coordinate all the subsystems involved in the mud circulation in order to optimize mud circulation efficiency and mud quality.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

The control system(s) described herein and corresponding computer hardware used to implement the various illustrative blocks, modules, elements, components, methods, and algorithms described herein can include a processor configured to execute one or more sequences of instructions, programming stances, or code stored on a non-transitory, computer-readable medium. The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), erasable programmable read only memory (EPROM)), registers, hard disks, removable disks, CD-ROMs, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the process steps described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to a processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

Some embodiments described herein include a method comprising: circulating a drilling mud through a mud circulation system that includes components (also referred to herein as subsystems) each having a controller coupled thereto; transferring operational parameters from each of the controllers to a central data storage; each controller accessing the operational parameters provided by other controllers via the central data storage; and each controller optimizing the operational parameters of the component coupled thereto based on the operational parameters provided by the other controllers. Such methods may further include: (1) wherein the components include a pump, a drill pipe, a choke, a mud cleaning unit, a mud treatment unit, and a mud tank; (2) wherein the components include a pump and the operational parameters of the pump include at least one of: pump rate or rate of change of pump rate; (3) wherein the components include a drill pipe and the operational parameters of the drill pipe include at least one of: weight on bit, rate of penetration, or revolution per minute; (4) wherein the components include a choke and the operational parameters of the choke include at least one of: bottom hole pressure or rate of change of bottom hole pressure; (5) wherein the components include a mud cleaning unit and the operational parameters of the mud cleaning unit include at least one of: shaker operational parameters, centrifuge operational parameters, hydrocyclone operational parameters, or separator operational parameters; (6) wherein the components include a mud treatment unit and the operational parameters of the mud treatment unit include at least one of: mixing rate, concentration of materials added to the mud, or rate of addition of the materials to the mud; (7) wherein the components include a mud tank and the operational parameters of the mud tank include at least one of: retention time or mixing parameters.

Some embodiments described herein include a system comprising: a flow path circulating a mud and including components each having a controller coupled thereto; and a central data storage communicable coupled to each controller. Such systems may include: wherein the components include a pump, a drill pipe, a choke, a mud cleaning unit, a mud treatment unit, and a mud tank.

Some embodiments described herein include a method comprising: circulating a drilling mud through a mud circulation system that includes components each having a controller coupled thereto; optimizing the operational parameters of each of the components with an optimization function to produce optimized operational parameters; transferring operational parameters from each of the components to a controller; and operating the components based on the optimized operational parameters. Such method may further include: wherein the optimization function is a cost function.

Some embodiments described herein include a system comprising: a flow path circulating a mud and including components each having a controller coupled thereto; and a central optimizer communicably coupled to each controller and configured to operate each controller within the operational limits of the component coupled thereto. Such systems may include: wherein the components include a pump, a drill pipe, a choke, a mud cleaning unit, a mud treatment unit, and a mud tank.

Embodiments described herein include Embodiment A, Embodiment B, Embodiment C, and Embodiment D.

Embodiment A is a method comprising: circulating a drilling mud through a mud circulation system that includes a plurality of subsystems each having a controller coupled thereto, wherein the plurality of subsystems comprise one or more selected from the group consisting of a pump, a drill pipe, a choke, a mud cleaning unit, a mud treatment unit, and a mud tank; transferring one or more operational parameters from each of the controllers of the plurality of subsystems to a central data storage; a first controller coupled to a first subsystem of the plurality of subsystems, accessing a first operational parameter from the one or more operational parameters from the central data storage; and the first controller optimizing a second operational parameter related to the first subsystem coupled thereto based on the first operational parameter operational parameter from the central data storage.

Embodiment A may optionally include one or more of the following: Element 1: wherein the plurality of subsystems include the pump and the first operational parameter of the pump comprises one or more selected from the group consisting of pump rate and rate of change of pump rate; Element 2: wherein the plurality of subsystems include the drill pipe and the first operational parameter of the drill pipe comprises one or more one selected from the group consisting of weight on bit, rate of penetration, and revolution per minute; Element 3: wherein the plurality of subsystems include the choke and the first operational parameter of the choke comprises one or more selected from the group consisting of bottom hole pressure and rate of change of bottom hole pressure; Element 4: wherein the plurality of subsystems include the mud cleaning unit and the first operational parameter of the mud cleaning unit comprises one or more selected from the group consisting of shaker operational parameters, centrifuge operational parameters, hydrocyclone operational parameters, and separator operational parameters; Element 5: wherein the plurality of subsystems include the mud treatment unit and the first operational parameter of the mud treatment unit comprises one or more selected from the group consisting of mixing rate, concentration of materials added to the mud, and rate of addition of the materials to the mud; and Element 6: wherein the plurality of subsystems include the mud tank and the first operational parameter of the mud tank comprises one or more selected from the group consisting of retention time and mixing parameters. Any combination of the foregoing may optionally be applied to Embodiment A.

Embodiment B is a method comprising circulating a drilling mud through a mud circulation system that includes a plurality of subsystems each having a controller coupled thereto, wherein the plurality of subsystems comprise one or more selected from the group consisting of a pump, a drill pipe, a choke, a mud cleaning unit, a mud treatment unit, and a mud tank; optimizing one or more operational parameters of each of the plurality of subsystems with an optimization function at a supervisory optimizer controller to produce one or more optimized operational parameters for each of the plurality of subsystems; transferring the one or more optimized operational parameters to the controller coupled to each of the plurality of subsystems; and operating the plurality of subsystems based on the one or more optimized operational parameters.

Embodiment B may optionally include one or more of the following: Element 7: wherein the plurality of subsystems include the drill pipe and the operational parameter of the drill pipe comprises one or more selected from the group consisting of weight on bit, rate of penetration and revolution per minute; Element 8: wherein the plurality of subsystems include the choke and the operational parameter of the choke comprises one or more selected from the group consisting of bottom hole pressure, and rate of change of bottom hole pressure; Element 9: wherein the plurality of subsystems include the mud cleaning unit and the operational parameter of the mud cleaning unit comprises one or more selected from the group consisting of shaker operational parameters, centrifuge operational parameters, hydrocyclone operational parameters, and separator operational parameters; Element 10: wherein the plurality of subsystems include the mud treatment unit and the operational parameter of the mud treatment unit comprises one or more selected from the group consisting of mixing rate, concentration of materials added to the mud, and rate of addition of the materials to the mud; and Element 11: wherein the plurality of subsystems include the mud tank and the operational parameter of the mud tank comprises one or more selected from the group consisting of retention time and mixing parameters. Any combination of the foregoing may optionally be applied to Embodiment B.

Embodiment C is a mud circulation system comprising: a drill pipe within a wellbore penetrating a subterranean formation and coupled to a first controller; a pump configured to convey a drilling mud through the drill string and the wellbore and coupled to a second controller; at least one subsystems coupled to a third controller that include one or more selected from the group consisting of a choke, a mud cleaning unit, a mud treatment unit, and a mud tank; a non-transitory computer-readable medium coupled to the drill string, the pump, or both and encoded with instructions that, when executed, cause the system to perform the method of Embodiment A or Embodiment B, including any optionally elements described herein.

Embodiment D is a non-transitory computer-readable medium communicably coupled to a mud circulation system and encoded with instructions that, when executed, cause the mud circulation system to perform the method of Embodiment A or Embodiment B, including any optionally elements described herein.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the invention embodiments disclosed herein are presented herein. Not all features of a physical implementation are described or shown in this application for the sake of clarity. It is understood that in the development of a physical embodiment incorporating the embodiments of the present invention, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

While compositions and methods are described herein in terms of "comprising" various components or steps, the compositions and methods can also "consist essentially of" or "consist of" the various components and steps.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The invention illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The following is claimed:

1. A method comprising:
    coordinating a plurality of subsystems of a mud circulation system to converge the mud circulation system to a global optima, each of the plurality of subsystems including an individual local controller controlling a respective subsystem of the plurality of subsystems;
    the method comprising for each local controller of a respective subsystem of the plurality of subsystems iteratively:
        executing a subsystem model of the respective subsystem controlled by the local controller and one or more interaction models to determine an estimate of a local operational parameter for a convergence, the executing of the subsystem model based, at least in part, on a set of states of one or more other subsystems of the plurality of subsystems and the one or more interaction models that model interactions among the plurality of subsystems;
        determining a local control parameter based, at least in part, on the estimate of the local operational parameter for the respective subsystem;
        controlling the respective subsystem according to the local control parameter; and
        after controlling the respective subsystem according to the local control parameter, communicating a state of the respective subsystem to one or more other local controllers of the plurality of subsystems.

2. The method of claim 1, wherein communicating the state of the respective subsystem to the one or more other local controllers comprises storing the state of the respective subsystem in a centralized database accessible by the local controllers of the plurality of subsystems.

3. The method of claim 2 further comprising storing the subsystem model and the local control parameter into the centralized database.

4. The method of claim 1, wherein at least two of the local controllers iterate at different time scales.

5. The method of claim 1, wherein the global optima relates to at least one of optimizing a rate of penetration of a drill bit, regulating a bottom hole pressure, retaining a cutting transmission efficiency, and minimizing a mud cost while drilling.

6. The method of claim 5, wherein a cost function corresponding to the global optima that relates to optimizing the rate of penetration of the drill bit comprises:
an integral of a weighted sum of
a first square of a difference between a current rate of penetration and an optimum rate of penetration,
a second square of a difference between an estimated bottom hole pressure and a sum of a kick pressure and fracture pressure,
a third square of a bit and motor wear,
a fourth square of a mud and drilling cost, and
a fifth square of a quality index of a wellbore.

7. The method of claim 1, further comprising determining the state of the respective subsystem after controlling the respective subsystem according to the local control parameter, wherein determining the state of the respective subsystem at least comprises obtaining a measurement of the local operational parameter.

8. The method of claim 1, wherein executing the subsystem model comprises executing the subsystem model based, at least in part, on the local control parameters of one or more other subsystems of the plurality of subsystems.

9. A mud circulation system comprising:
a centralized database;
a plurality of subsystems that each comprise a local controller, each of the local controllers associated with a respective subsystem of the plurality of subsystems and comprising,
a processor,
a non-transitory machine-readable medium having instructions stored thereon for coordinating the respective subsystem with one or more others of a plurality of subsystems to converge the mud circulation system to a global optima, the instructions executable by the processor to cause the local controller to iteratively,
execute a subsystem model of the respective subsystem controlled by the local controller and interaction models to determine an estimate of a local operational parameter for a convergence, the execution of the subsystem model being based, at least in part, on states of one or more other subsystems of the plurality of subsystems and the interaction models that model interactions among the plurality of subsystems;
determine a local control parameter based, at least in part, on the local operational parameter estimate;
control the respective subsystem according to the local control parameter; and
after the respective subsystem has been controlled according to the local control parameter, communicate state of the respective subsystem to the other local controllers.

10. The mud circulation system of claim 9, wherein the non-transitory machine-readable medium further has instructions stored thereon executable by the processor to cause the local controller to retrieve at least a set of states of the other subsystems and a set of local control parameters of the other local controllers from the centralized database.

11. The mud circulation system of claim 10, wherein the instructions to cause the local controller to retrieve at least the set of states of the other subsystems and the set of local control parameters of the other local controllers from the centralized database comprise instructions executable by the processor to cause the local controller to retrieve according to a different time scale than another of the local controllers.

12. The mud circulation system of claim 9, wherein the instructions to communicate the state of the respective subsystem to the one or more other local controllers comprise instructions executable by the processor to cause the local controller to store the state of the respective subsystem in the centralized database accessible by the local controllers of the plurality of subsystems.

13. The mud circulation system of claim 12, wherein the instructions to communicate the state of the respective subsystem to the one or more other local controllers further comprise instructions executable by the processor to cause the local controller to store the subsystem model and the local control parameter for the respective subsystem into the centralized database.

14. The mud circulation system of claim 9, wherein the plurality of subsystems comprises a pump, a choke, a drill pipe, a mud cleaning unit, a mud treatment unit, and a mud tank.

15. The mud circulation system of claim 9, wherein the non-transitory machine-readable medium further has instructions stored thereon executable by the processor to cause the local controller to determine the state of the respective subsystem after the respective subsystem has been controlled according to the local control parameter, wherein the instructions to determine the state of the respective subsystem at least comprise instructions to obtain a measurement of the local operational parameter.

16. The mud circulation system of claim 9, wherein the instructions to execute the subsystem model of the respective subsystem further comprise instructions to execute the subsystem model of the respective subsystem based, at least in part, on the local control parameters of the one or more other subsystems.

17. A subsystem of a mud circulation system comprising:
a local controller that comprises a processor; and
a non-transitory machine-readable medium having instructions stored thereon that are executable by the processor to cause the local controller to,
execute a subsystem model of a respective subsystem controlled by the local controller and interaction models to determine an estimate of a local operational parameter for a convergence to a global optima of the mud circulation system, the execution of the subsystem model based, at least in part, on states of one or more other subsystems of a plurality of subsystems and the interaction models that model interactions among the plurality of subsystems;
determine a local control parameter for the respective subsystem based, at least in part, on the local operational parameter estimate;

control the respective subsystem according to the local control parameter; and after the respective subsystem has been controlled according to the local control parameter, communicate a state of the respective subsystem to one or more other local controllers in the mud circulation system.

18. The subsystem of the mud circulation system of claim 17, wherein the non-transitory machine-readable medium further has instructions stored thereon executable by the processor to cause the local controller to retrieve at least a set of states of the one or more other subsystems and a set of one local control parameters of the one or more other local controllers from a centralized database.

19. The subsystem of the mud circulation system of claim 18, wherein the instructions to cause the local controller to retrieve at least the set of states of the one or more other subsystems and the set of local control parameters of the one or more other local controllers from the centralized database are executable by the processor to cause the local controller to retrieve according to a different time scale than another of the other local controllers.

20. The subsystem of the mud circulation system of claim 17, wherein the instructions to communicate the state of the respective subsystem to the one or more other local controllers comprise instructions executable by the processor to cause the local controller to store the state of the respective subsystem in a centralized database accessible by the local controller and the one or more other local controllers in the mud circulation system.

* * * * *